United States Patent [19]

Baughman

[11] Patent Number: 5,135,603

[45] Date of Patent: Aug. 4, 1992

[54] QUARTZ CRYSTAL GROWTH

[75] Inventor: Richard J. Baughman, Albuquerque, N. Mex.

[73] Assignee: The United States of America as represented by the United States Department of Energy, Washington, D.C.

[21] Appl. No.: 363,346

[22] Filed: Mar. 11, 1982

[51] Int. Cl.[5] ............................................. C30B 7/10
[52] U.S. Cl. .......................... 156/623 Q; 156/DIG. 64
[58] Field of Search ........ 156/623 R, 623 Q, DIG. 64

[56] References Cited

U.S. PATENT DOCUMENTS

| 3,101,259 | 8/1963 | Sawyer | 156/623 Q |
|---|---|---|---|
| 3,356,463 | 12/1967 | Ballman et al. | 156/623 Q |
| 3,394,081 | 7/1968 | Ballman et al. | 156/623 Q |
| 3,805,044 | 4/1974 | Bhattacharyya et al. | 156/623 Q |
| 3,832,146 | 8/1974 | Bresnahan et al. | 156/623 Q |
| 3,936,276 | 2/1976 | Balitsky et al. | 156/623 Q |
| 4,021,294 | 5/1977 | Khadzhi et al. | 156/623 Q |
| 4,956,047 | 9/1990 | Harris et al. | 156/623 Q |

FOREIGN PATENT DOCUMENTS

| 601552 | 5/1948 | United Kingdom | 156/623 Q |
|---|---|---|---|
| 792724 | 4/1958 | United Kingdom | 156/623 Q |

Primary Examiner—Edward A. Miller
Attorney, Agent, or Firm—Armand McMillan; James H. Chafin; William R. Moser

[57] ABSTRACT

A process for growing single crystals from an amorphous substance that can undergo phase transformation to the crystalline state in an appropriate solvent. The process is carried out in an autoclave having a lower dissolution zone and an upper crystallization zone between which a temperature differential ($\Delta T$) is maintained at all times. The apparatus loaded with the substance, solvent, and seed crystals is heated slowly maintaining a very low $\Delta T$ between the warmer lower zone and cooler upper zone until the amorphous substance is transformed to the crystalline state in the lower zone. The heating rate is then increased to maintain a large $\Delta T$ sufficient to increase material transport between the zones and rapid crystallization. $\alpha$-Quartz single crystal can thus be made from fused quartz in caustic solvent by heating to 350° C. stepwise with a $\Delta T$ of 0.25°–3° C., increasing the $\Delta T$ to about 50° C. after the fused quartz has crystallized, and maintaining these conditions until crystal growth in the upper zone is completed.

6 Claims, 1 Drawing Sheet

QUARTZ CRYSTAL GROWTH

This invention relates to a process for growing α-quartz single crystals from a fused amorphous silica nutrient. The U.S. Government has rights in this invention pursuant to Contract No. DE-AC04-76DP00789 between the U.S. Department of Energy and Western Electric Company.

BACKGROUND OF THE INVENTION

The constantly increasing demand for synthetic quartz crystals by the communications, telephony, electric watch, and frequency and time standard industries, has pushed commercial sources beyond present capacities, both with respect to quantity and quality of crystal supply. Most of the synthetic material currently supplying this demand consists of crystals grown from natural crystalline quartz nutrient handpicked for quality but of limited purity level.

Considering the existence of vast supplies of amorphous silica on this continent, it would be advantageous if such a material could be used to grow synthetic crystals. Very high purity fused silica is now being produced from these sources and is now readily available. Past efforts to grow high quality quartz crystals from amorphous nutrient have not been too successful: poor quality crystals have been obtained that are off-color and near opaque, as well as physically criss-crossed with multiple fractures. Buehler, in U.S. Pat. 2,785,058, briefly discussed some of these efforts in his review of the art. Walker, also, reports on the ineffectiveness of the constant temperature hydrothermal method for growing quartz crystals from amorphous silica, and solves the problem by resorting to a temperature difference method using a crystalline quartz nutrient. ("Hydrothermal Synthesis of Quartz Crystals.") Sawyer (3,101,259) similarly grows crystals from an aqueous sodium carbonate solution of a siliceous material such as pure natural quartz crystals in an autoclave in which there is maintained a temperature difference ranging from 4° to 19° C. between the lower mineral-dissolving chamber, typically at about 356° C., and the upper crystal-growing chamber, typically at about 339° C.

Among the methods of obtaining quartz crystals from amorphous silica that have been alluded to earlier, that of Brogue et al. (2,680,677) involves the disposition of α-quartz on α-quartz seed crystals at temperatures within the range of 500°–550° C. at a pressure of 1200 psig. A thirty-fold weight increase of the seed is disclosed. More recently, Hoover (2,965,448) discloses a process for converting amorphous silica into a form of crystalline quartz, using a temperature range of 450° to 700° C. at a pressure of 1500 to 3200 atmospheres for a period of about 10 hours. Hoover, however, is not concerned with single crystal growth.

Other patents of interest in the quartz crystal growing field include: Kohman (2,895,812) which discloses the use of a baffle between the solution zone and the crystallization zone of the quartz-growing autoclave, and Chardonnet (2,914,389), Turobinsici (2,931,712), and Jafee et al. (2,923,605), who disclose various seed configurations and arrangements.

OBJECTS OF THE INVENTION

The principal object of the invention is to provide high quality synthetic single crystals of α-quartz from a fused silica nutrient. Another object is to develop a process which allows reliable production of said crystals by rigorous control of operating conditions. A further object is to provide crystals substantially free of aluminum and iron ions so as to obviate the inclusion of crystal charge compensators such as lithium, sodium, and hydrogen ions. Still another object is to provide quartz crystals for optical instruments and in resonators used in secondary frequency standards and in radiation hardened assemblies.

Additional objects, advantages, and novel features of the invention will be set forth in part in the description which follows, and in part will become apparent to those skilled in the art upon examination of the following text, or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purpose of the invention as embodied and broadly described herein, HF-etched and washed fused silica is placed in an autoclave pressure vessel with the required caustic solution and HF-etched prepared seed plates. The top closure is applied and the vessel connected to various heaters, thermocouples, and high pressure fittings. The assembled apparatus and charge are then allowed to rest for at least 16 hours in order to come to equilibrium. After this rest period, the heat-up cycle begins.

A typical heat-up cycle requires approximately 10 days and proceeds as follows:

1. During an 8 to 12-hour period, the temperature of the autoclave is continuously increased from ambient temperature to a top heat zone temperature of 200°±25° C., while maintaining a temperature differential $\Delta T = 0.25°$ to 3° C. between the top heat zone and the bottom heat zone. In other words, the bottom heat zone is kept at a temperature 0.25° to 3° C. higher than the top heat zone.

2. The top heat zone temperature is maintained for a period of 15 to 20 hours at $\Delta T = 0.25°$ to 3° C.

3. The top heat zone temperature is continuously increased from 200°±25° to 250°±25° C. during an 8 to 12-hour period with the $\Delta T = 0.25°$ to 3° C. maintained.

4. The top heat zone temperature of 250°±25° C. is held for a period of 15 to 20 hours with a $\Delta T = 0.25°$ to 3° C.

5. The top heat zone temperature is continuously increased from 250°±25° C. to 350°±25° C. during a 45 to 50-hour period with the $\Delta T = 0.25°$ to 3° C. maintained.

6. During a period of 120 to 144 hours, the bottom heat zone temperature is continuously increased to achieve a $\Delta T = 50° \pm 10$ C.

7. The top heat zone is held at 350°±25° C. and the bottom heat zone at a temperature sufficient to maintain a $\Delta T = 50° \pm 10°$ C. until crystal growth is completed.

8. The top and bottom heating zone temperatures are then reduced during a period of 20 to 30 hours at a rate such that they will arrive at ambient temperature simultaneously. The autoclave may then be unloaded.

The nutrient and seed plate chemical etch, the 16-hour caustic soak period, and the low zone temperature differential during the long heat-up period allow the epitaxially-grown crystal to knit onto the seed plate with such perfection that the interface is extremely difficult to detect even with the use of a Tyndall beam or laser beam light.

The relatively slow heat-up cycle coupled with the very low zone temperature differential allows the fused silica nutrient to be converted from the amorphous, non-crystalline phase to a crystalline phase before excessive dissolution and subsequent uncontrolled material transport can occur. Once this phase transformation has taken place, the nutrient solubility is reduced to a level that is easily controlled and crystal growth then proceed to completion.

The process may be employed with other substances similar to fused quartz in that they can undergo a phase change in an appropriate solvent while being heated slowly with a very low $\Delta T$ in a two zone apparatus, as described herein.

BRIEF DESCRIPTION OF THE DRAWINGS

Various other objects, features, and attendant advantages of the present invention will be more fully appreciated as they become better understood when considered in conjunction with the accompanying drawings, wherein.

DETAILED DESCRIPTION OF THE INVENTION

Figure 1:
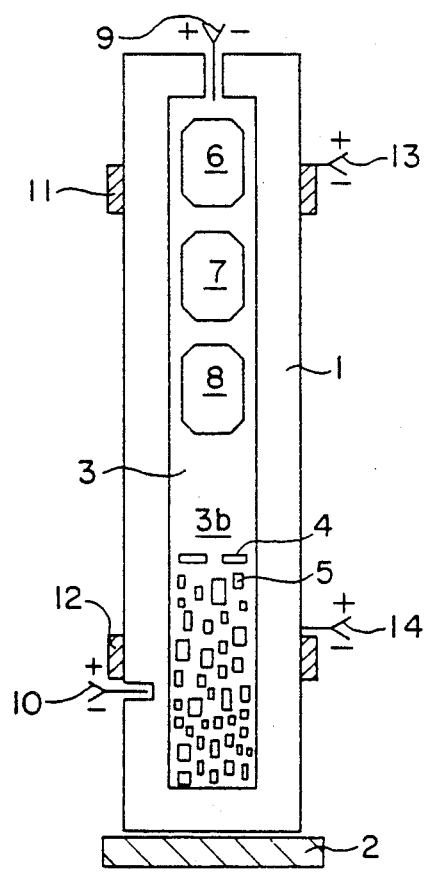
FIG. 1 illustrates in cross-section the type of autoclave pressure vessel used to carry out the process of the invention.

The pressure vessel employed to carry out the process of the invention can be seen in cross-section in FIG. 1. The apparatus comprises a pressure vessel 1 made of 4340E steel, standing on bottom plate 2. The cylindrical inner chamber 3 of the vessel has a diameter 31.75 mm and a length of 317.5 mm. The closure, not shown, is of a modified Bridgman type.

A 5% baffle 4 located 102 mm above the inside floor of the cylinder, effectively divides the cylindrical inner chamber 3 a nutrient zone 3a in which fused silica pieces 5 are placed and an upper crystal growth zone 3b in which the $\alpha$-quartz crystals 6, 7, and 8 are formed. Thermocouples 9 and 10 monitor the actual temperature in each zone.

Figure 2:
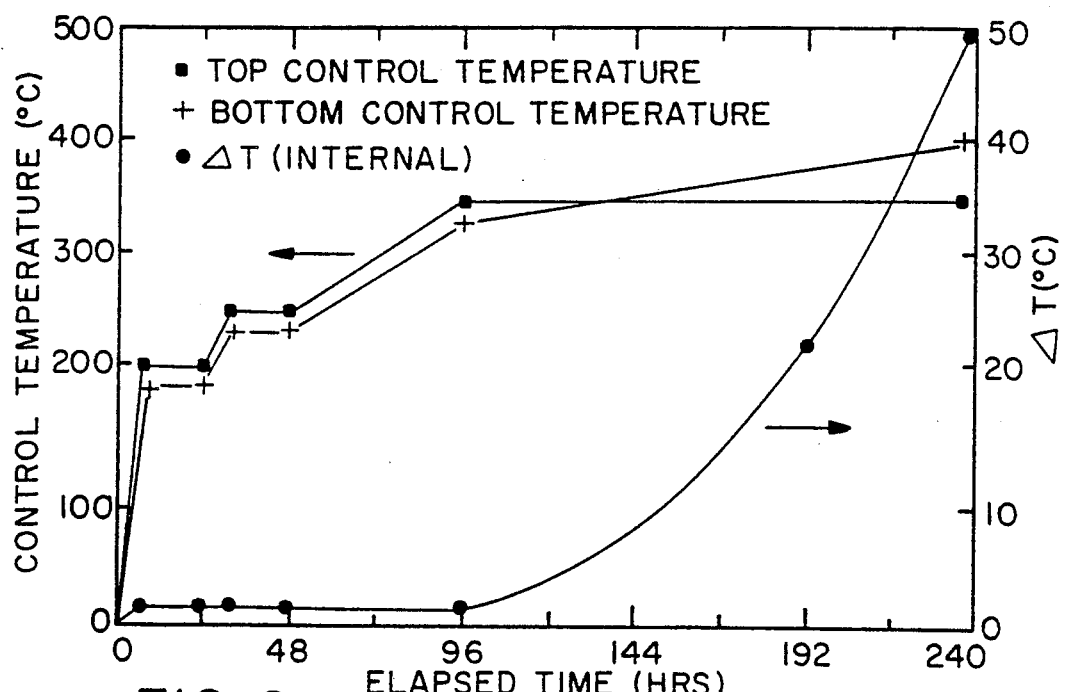
FIG. 2 shows the external control thermocouples heat profile curves necessary to produce the required internal zone temperatures and temperatures differential ($\Delta T$) in the type of apparatus shown in FIG. 1.

Two band type heaters 11 and 12, rated at 425 watts each, controlled through thermocouples 13 and 14 with Barber-Coleman series 520 solid state controllers (not shown) using 3.4 KVA Barber-Coleman SCR power supplies (not shown), provide the heat needed for the process. The growth run external temperature profile, shown in FIG. 2, necessary to achieve the internal zone temperatures and temperature differential required by the configuration in FIG. 1, is supervised by a Leeds & Northrup 1300 process programmer (not shown). The pressure within chamber 3 is monitored with a Teledyne-Tabor pressure transducer (not shown).

The following example illustrates the process of the invention as carried out with the equipment just described. It is to be understood, however, that said process is only limited by the claims following the present description.

EXAMPLE

The following materials were used in this preparation. The sodium hydroxide was in pellet form, Aristor grade. The lithium carbonate had a purity of 99.999%. The fused silica nutrient, Suprasil 2 grade, came in solid rods with 6 mm and 9 mm diameters. The seed plates, from the Bell Laboratories in Murray Hill, New Jersey, were AT-oriented and were cut to a width of 20.5 mm, a length of 31.75 mm, and thickness of 1.125 mm. Analytical data on the impurities contained in these materials are recorded in the table below.

The growing of $\alpha$-quartz single crystals from the materials just described was accomplished as follows:

The fused silica nutrient, an assortment of 6mm and 9mm diameter rods, was cut to size, i.e., in pieces with lengths equal to the rod diameters. The resulting fused silica pieces and crystal seed plates were etched for 30 minutes in 48% hydrofluoric acid. The etched materials were then rinsed several times with distilled water and loaded directly in the autoclave in their appropriate position. Sufficient growth solvent, aqueous 1.0 M sodium hydroxide +0.025 M lithium carbonate, was added to the autoclave so that a pressure of approximately 30,000 psig could be obtained once the final growth temperatures had been reached. The top closure was then sealed into place.

The loaded autoclave was connected to the band heaters, various thermocouples, and high pressure tube fittings. The entire autoclave assembly was then surrounded with a 200 mm thick layer of insulation material, and allowed to stand for an 18-hour period. After this rest period, the heating cycle was begun. This cycle is graphically illustrated in FIG. 2.

During an 8-hour period, the top heat zone temperature was continuously increased from ambient temperature to 200° C. while maintaining a zone temperature differential, $\Delta T$, of 2° to 4° C. (i.e., the top $\Delta T$ thermocouple 9 on FIG. 1 was kept at 2°–4° C. lower than the bottom $\Delta T$ thermocouple 10). This temperature arrangement was maintained for 16 hours. During a second 8-hour period, the top heat zone temperature was increased continuously from 200° to 250° C., while maintaining $\Delta T = 2°-4°$ C. This temperature profile was again held for a 16-hour soak period. Then, during a 48-hour period, the top heat zone temperature was increased continuously from 250° to 350° C. while still maintaining $\Delta T = 2°-4°$ C. At that point, the crystal growth chamber was now at final growth temperature and the fused silica nutrient had been converted to the crystalline phase. Little, if any, growth had taken place so far.

To establish an accelerated growth rate, the bottom zone temperature was continuously increased over a 144-hour period to achieve a $\Delta T = 50°$ C. This temperature profile was then maintained until crystal growth had been completed, a period of about 190–200 hours for the autoclave capacity involved. Then, during a 24-hour period, the temperature of both the top and bottom heat zones was reduced at a rate such that both reached ambient temperature simultaneously. The autoclave was then opened and the crystals removed.

High quality, transparent, and colorless single crystals measuring up to 45 mm length, 25 mm width, and 20 mm thickness have been obtained repeatedly in this manner. The crystals were of very good optical quality, with the knit area, i.e., the area where new crystal growth epitaxially connects the seed crystal, being very difficult to observe even when using a Tyndall or laser light beam. With the apparatus described, these crystals were produced to each growth run, the center one (7 on FIG. 1) being the largest and best formed.

The following table presents partial chemical analytical data on the starting materials, the solvent, the quartz crystals, and the autoclave residue.

| SAMPLE | ANALYTICAL DATA (in parts per million[1]) | | | | | | | | |
|---|---|---|---|---|---|---|---|---|---|
| | Li | Na | K | Al | Fe | Mn | Ni | Cr | Sn |
| Fused silica[2] Suprasil 2 | <.1 | .15 | <.5 | .5 | .3 | <.001 | <2.0 | <1.0 | |
| NaOH[3] | | | 4.4 | 1.8 | 11.0 | | | | |
| Li$_2$CO$_3$[3] | | | | 13.0 | 16.0 | | | 2.2 | |
| H$_2$O | <.003 | <.005 | <.1 | .02 | .05 | | | | <.6 |
| Solvent[4] | | | | .035 | .16 | .005 | .011 | .019 | |
| Quartz Crystal[5] | .05 | 1.1 | <.5 | 6.0 | <.25 | <.002 | <2.0 | <2.0 | |
| Residue | 110 | 4000 | 15 | 5.0 | 75 | 1.3 | <5.0 | 1.1 | |

[1]Averaged results.
[2]Suprasil 2.
[3]Dry Material.
[4]Nutrient solution, as in Example.
[5]Product α-quartz crystal.

It should be kept in mind that the temperature differential value between the lower dissolution zone and the upper crystallization zone of the apparatus are dependent upon the physical relationship of the temperatures sensors involved and therefore, may differ from those required by different designs. In the specific apparatus reported upon here, the differential, $\Delta T$, is measured by a bottom thermocouple (FIG. 1, 10) enclosed in the autoclave wall 38 mm above the inside bottom surface and 9.5 mm out from the inside wall surface. The top thermocouple (FIG. 1, 9), on the other hand, is immersed in the growth solvent at the inside top surface of the growth chamber when the top closure assembly is in place. With a $\Delta T = 50°$ C. profile, the thermal gradient is 1.8° C./cm.

The problem that the present invention solves arises from the high solubility of fused silica in caustic solution. That solubility allows massive transport of silicate materials, resulting in uncontrollable desposition of nutrient on the seed crystals as well as in spurious nucleation and growth. The problem is compounded by the transformation of fused silica from the amorphous to the crystalline phase early in the growth procedure. This transformation continually changes the material transport rate because of the large difference in solubility between the two SiO$_2$ phases.

The problem has been solved by conversion of the amorphous material to the crystalline phase before the physical parameters of high solubility and massive transport are attained. In this approach, a gentle delayed increase in temperature and Pressure allows the phase transformation to take place before massive dissolution can occur. By maintaining a small $\Delta T$, transfer of the nutrient is controlled during the period when high solubility is expected. After the phase transformation has been accomplished, $\Delta T$ is gradually increased to allow normal nutrient transport and crystal growth. This delayed temperature/pressure increase coupled with a small $\Delta T$ also allows the caustic solvent ample time to gently etch the crystal seed plates. As a result, new growth begins at a very slow rate, producing crystals with a very well formed knit region.

It must be kept in mind that $\Delta T$ values that are successful with any given autoclave configuration are dependent upon and inversely proportional to the total inner volume of said autoclave. In other words larger volume autoclaves require lower $\Delta T$ values to accomplish successful crystal growth than do smaller volume autoclaves.

Having thus pointed out the essence of the process of the invention and having illustrated this process with the best embodiment currently known to the inventors, it remains obvious that many modifications and variations can be made in the apparatus employed and in the process by those skilled in the art without departing from the spirit and the scope of the following claims.

What is claimed is:

1. A process for growing high quality single crystals of a nutrient substance that can undergo phase transformation from the amorphous to the crystalline state in an appropriate solvent, said process comprising:
   (a) charging the substance, seed crystals of the substance, and the solvent in an autoclave having a lower dissolution zone connecting with an upper crystallization zone;
   (b) allowing the closed charged autoclave to stand at ambient temperature for a time sufficient to reach internal equilibrium;
   (c) gradually heating the autoclave at a rate such that a very small temperature differential ($\Delta T$) is maintained between the cooler upper zone and the warmer lower zone until the nutrient substance has undergone transformation to the crystalline phase; and
   (d) increasing the heating rate to achieve and maintain a larger temperature differential ($\Delta T$) between the zones sufficient to allow increased material transport between the zones and rapid controlled crystal growth.

2. The process of claim 1 wherein the nutrient substance is solid fused silica and the solvent is an aqueous caustic solution containing lithium carbonate.

3. The process of claim 2 wherein the fused silica is in the form of solid pea size lumps and the solvent is an aqueous 1.0M NaOH+0.025M Li$_2$CO$_3$ solution.

4. The process of claim 3 wherein the charged autoclave is held allowed to stand at ambient temperature and pressure for a period of at least 16 hours.

5. The process of claim 3 wherein the charged autoclave is subjected to the following heating regime, after standing at ambient temperature and pressure for a period of 16 to 20 hours:
   (a) in an 8 to 12-hour period, the temperature of the autoclave is continuously increased from ambient temperature to an upper zone temperature of 200°±25° C. while maintaining a $\Delta T$ within the range of about 0.25° to 3° C;

(b) the temperature of 200°±25° C. and ΔT=0.25 to 3° C. conditions are kept for a period of 15 to 20 hours;

(c) in another 8 to 12-hour period, the temperature of the autoclave is continuously increased from an upper zone level of 200°±25° C. to 250°±25° C., while maintaining ΔT=about 0.25°-3° C.;

(d) the temperature of 250°±25° C. and ΔT=0.25° to 3° C. conditions are kept for a period of 15 to 20 hours;

(e) in a 45 to 50-hour period, the temperature of the autoclave is continuously increased from an upper zone level of 250 ±25° C. to 350 ±25° C., while maintaining ΔT=about 0.25°-3° C.;

(f) in a 120 to 144-hour period, the temperature of the lower zone of the autoclave is continuously increased to achieve ΔT=50°±10° C.;

(g) the upper zone temperature of 350°±25° C. and the lower zone temperature necessary to maintain ΔT=50°±10° C. are held until crystal growth is substantially completed;

(h) in a 20 to 30-hour period, the temperature of the upper and lower zones are reduced at a rate such that they reach ambient temperature simultaneously.

6. The process of claim 5 wherein the heating regime comprises:

(a) ambient temperature to 200° C. in upper zone in 8 hours with ΔT=2° C.;

(b) 16 hours at 200° C. with ΔT=2° C.;

(c) 200° to 250° C. in upper zone in 8 hours with ΔT=2° C.;

(d) 16 hours at 200° C. with ΔT=2° C.;

(e) 250° C. to 350° C. in upper zone in 48 hours with ΔT=2° C.;

(f) lower zone temperature increased to obtain ΔT=50° C. in 144 hours; and (g) 350° C. in upper zone with ΔT=50° C. until crystal growth is substantially complete.

* * * * *